United States Patent
Danno

(10) Patent No.: US 10,094,041 B2
(45) Date of Patent: Oct. 9, 2018

(54) SIC SINGLE CRYSTAL AND METHOD OF PRODUCING SAME

(75) Inventor: Katsunori Danno, Susono (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 922 days.

(21) Appl. No.: 14/128,834

(22) PCT Filed: Aug. 2, 2011

(86) PCT No.: PCT/JP2011/068016
§ 371 (c)(1),
(2), (4) Date: Dec. 23, 2013

(87) PCT Pub. No.: WO2013/005347
PCT Pub. Date: Jan. 10, 2013

(65) Prior Publication Data
US 2014/0127466 A1    May 8, 2014

(30) Foreign Application Priority Data
Jul. 4, 2011 (JP) .................. 2011-148388

(51) Int. Cl.
*C30B 11/14* (2006.01)
*C30B 29/36* (2006.01)
*C30B 9/06* (2006.01)

(52) U.S. Cl.
CPC ............... *C30B 11/14* (2013.01); *C30B 9/06* (2013.01); *C30B 29/36* (2013.01); *Y10T 428/24488* (2015.01)

(58) Field of Classification Search
CPC ........... C30B 9/06; C30B 11/14; C30B 29/36; Y10T 428/24488
See application file for complete search history.

(56) References Cited

U.S. PATENT DOCUMENTS

| 6,534,026 | B2 | 3/2003 | Vodakov et al. |
| 6,562,130 | B2 | 5/2003 | Vodakov et al. |

(Continued)

FOREIGN PATENT DOCUMENTS

| CN | 103562443 A | 2/2014 |
| EP | 2 690 205 | 1/2014 |

(Continued)

OTHER PUBLICATIONS

Daikoku, H. et al., "Method for Producing SiC Single Crystals and Producing Device," U.S. Appl. No. 14/006,640, filed Sep. 20, 2013.

*Primary Examiner* — Hua Qi
(74) *Attorney, Agent, or Firm* — Finnegan, Henderson, Farabow, Garrett & Dunner, LLP

(57) ABSTRACT

A SiC single crystal having high crystallinity and a large diameter is provided.
A SiC single crystal comprising a seed crystal with a c-plane and a non-c-plane, and a c-plane growth portion and an enlarged diameter portion that have grown from the c-plane and the non-c-plane of the seed crystal as origins in the direction of the c-plane and the direction of the non-c-plane, wherein a continuous region free of threading dislocations is present in a peripheral portion of a plane that is parallel to the c-plane of the seed crystal, and contains the seed crystal and the enlarged diameter portion, wherein the area of the continuous region occupies 50% or more of the total area of the plane.

4 Claims, 8 Drawing Sheets

(56) References Cited

U.S. PATENT DOCUMENTS

| | | | |
|---|---|---|---|
| 7,294,324 B2 | 11/2007 | Powell et al. | |
| 7,314,520 B2 | 1/2008 | Powell et al. | |
| 7,314,521 B2 | 1/2008 | Powell et al. | |
| 2002/0049129 A1* | 4/2002 | Vodakov | C01B 31/36 501/88 |
| 2003/0070611 A1 | 4/2003 | Nakamura et al. | |
| 2007/0158785 A1 | 7/2007 | D'Evelyn et al. | |
| 2007/0209573 A1* | 9/2007 | Kusunoki | C30B 9/06 117/28 |
| 2009/0184327 A1* | 7/2009 | Oyanagi | C30B 19/04 257/77 |
| 2010/0199910 A1 | 8/2010 | Watanabe et al. | |
| 2012/0118221 A1 | 5/2012 | Danno et al. | |
| 2013/0042802 A1 | 2/2013 | Danno et al. | |

FOREIGN PATENT DOCUMENTS

| | | | |
|---|---|---|---|
| JP | 2003-119097 | | 4/2003 |
| JP | 2008-100854 | | 5/2008 |
| JP | 2008-105896 | | 5/2008 |
| JP | 2008105896 A | * | 5/2008 |
| JP | 2008-230946 | | 10/2008 |
| JP | 2010-184829 | | 8/2010 |
| JP | 2010184838 A | * | 8/2010 |
| JP | 2011-98871 | | 5/2011 |
| WO | WO 01/63020 | | 8/2001 |
| WO | WO 2011/007457 | | 1/2011 |
| WO | WO 2011/007458 | | 1/2011 |

* cited by examiner

SIC SINGLE CRYSTAL AND METHOD OF PRODUCING SAME

CROSS-REFERENCE TO RELATED APPLICATIONS

This application is a national phase application of International Application No. PCT/JP2011/068016, filed Aug. 2, 2011, and claims the priority of Japanese Application No. 2011-148388, filed Jul. 4, 2011, the content of both of which is incorporated herein by reference.

TECHNICAL FIELD

The present invention relates to a SiC single crystal suitable for a semiconductor device and a method of producing the same; more particularly relates to a high quality SiC single crystal with minimal dislocation or defect, and a method of producing a high quality SiC single crystal by using a solution process.

BACKGROUND ART

A SiC single crystal is thermally and chemically very stable, superior in mechanical strengths, and resistant to radiation, and also has superior physical properties, such as high dielectric breakdown voltage and high thermal conductivity compared to a Si single crystal. Therefore it can achieve high power, high-frequency, high voltage resistance, high environmental resistance, etc., that conventional semiconductor materials, such as a Si single crystal and a GaAs single crystal have not been able to realize, and has been attracting interest as a next-generation semiconductor material covering a broad range, including a power device material enabling high-power regulation or energy saving, a device material for high speed large volume information communication, an in-vehicle high temperature device material, and a radiation resistant device material.

As typical growth processes for a SiC single crystal, a gas-phase process, an Acheson process, and a solution process have been heretofore known. With respect to a gas-phase process, for example, a sublimation process has a drawback in that a lattice defect and a crystal polymorph, such as a through-hole like defect referred to as a micro-pipe defect and a stacking fault are apt to appear in a grown single crystal. However, most SiC bulk single crystals have been heretofore produced by a sublimation process due to its high crystal growth speed, and some trials have been conducted to reduce defects in a grown crystal (Patent Literature 1). In an Acheson process, since silica stone and coke are used as source materials, which are heated in an electrical oven, it is not possible to obtain a high crystallinity single crystal due to impurities in the source materials.

In a solution process, melted Si or melted Si containing an alloy melt is formed in a graphite crucible, C of the graphite crucible is dissolved into the melt, and a crystalline layer of SiC is allowed to be deposited on a seed crystal substrate placed at a low temperature region, and to grow. Since, in a solution process, a crystal is grown under conditions closer to a thermal equilibrium compared to a gas-phase process, it can be expected that defects are reduced. Consequently, some production processes for a SiC single crystal based on a solution process have been recently proposed (Patent Literature 2).

CITATION LIST

Patent Literature

[Patent Literature 1] Japanese Unexamined Patent Application Publication No. 2003-119097
[Patent Literature 2] Japanese Unexamined Patent Application Publication No. 2008-105896

SUMMARY OF INVENTION

Problem to be Solved by the Invention

As described in Patent Literature 1 or Patent Literature 2, trials have been conducted to reduce dislocations or defects in a grown crystal by a sublimation process or a solution process. However, it is still difficult to produce a high quality SiC single crystal free of dislocations being several mm square in high yield. It is difficult to obtain a single crystal without any threading dislocation by a sublimation process. In a solution process, although threading dislocations tend to decrease in a region of an enlarged diameter part in the case of single crystal growth of Si, etc., diameter enlargement of a grown crystal is not easy at all, and the growth speed is slow in the case of solution growth of SiC, since SiC is grown by utilizing a reaction between Si and C, but not a reaction of a solid to a liquid as growth of Si in a melt. Therefore, it is industrially very difficult to enlarge the diameter while conducting c-plane growth, due to enormous time and costs involved. As the result, a SiC single crystal with better crystallinity and a large diameter has been sought.

As described above, the above processes are still not satisfactory to stably produce a high quality SiC single crystal usable as a semiconductor device. The present invention is to solve the problems and make it possible to produce a large diameter SiC single crystal by a solution process, and especially has an object to provide a high quality SiC single crystal having reduced density of threading dislocations, such as a screw dislocation, an edge dislocation, and a micro-pipe defect, and further, a high quality SiC single crystal having reduced also stacking faults and basal plane dislocations, as well as a method of producing such a SiC single crystal.

Solution to Problem

The inventor diligently sought a high quality SiC single crystal that can reduce the density of threading dislocations, such as a screw dislocation, an edge dislocation, and a micro-pipe defect, which may appear in a grown crystal during a production of a SiC single crystal by a solution process, as well as a high quality SiC single crystal having reduced also stacking faults and basal plane dislocations. As the result, the inventor found that a high quality SiC single crystal having remarkably reduced density of threading dislocations can be produced by performing c-plane growth and at the same time enlarging the diameter of a growing crystal, and further a high quality SiC single crystal also having reduced stacking faults and basal plane dislocations can be produced.

The present invention is a SiC single crystal comprising a seed crystal with a c-plane and a non-c-plane, and a c-plane growth portion and an enlarged diameter portion that have grown from the c-plane and the non-c-plane of the seed crystal as origins in the direction of the c-plane and the direction of the non-c-plane, wherein a continuous region free of threading dislocations is present in a peripheral portion of a plane that is parallel to the c-plane of the seed crystal and contains the seed crystal and the enlarged diameter portion, wherein the area of the continuous region occupies 50% or more of the total area of the plane.

The present invention is also a method of producing a SiC single crystal by a solution process, wherein a SiC seed crystal is contacted with a Si—C solution with a temperature gradient, in which the temperature decreases from the inside toward the surface, allowing a single crystal to grow, wherein the seed crystal comprises a bottom surface placed parallel to the surface of the Si—C solution, a top surface held by a graphite shaft, and side surfaces, wherein the method comprises contacting the bottom surface and the side surfaces of the seed crystal with the Si—C solution to form a meniscus between the side surfaces of the seed crystal and the Si—C solution such that the graphite shaft does not come in contact with the Si—C solution; and growing a crystal from the seed crystal allowing the diameter to enlarge.

Advantageous Effects of Invention

According to the present invention, a crystal in a shape in which its diameter enlarges from a seed crystal as an origin can be obtained, and a large diameter SiC single crystal free of threading dislocations can be produced.

DESCRIPTION OF EMBODIMENTS

An embodiment of the present invention relates to a SiC single crystal comprising a seed crystal with a c-plane and a non-c-plane, and a c-plane growth portion and an enlarged diameter portion that have grown from the c-plane and the non-c-plane of the seed crystal as origins in the direction of the c-plane and the direction of the non-c-plane, wherein a continuous region free of threading dislocations is present in a peripheral portion of a plane that is nearly parallel to the c-plane of the seed crystal and contains the seed crystal and the enlarged diameter portion, wherein the area of the continuous region occupies 50% or more of the total area of the plane.

Figure 3:
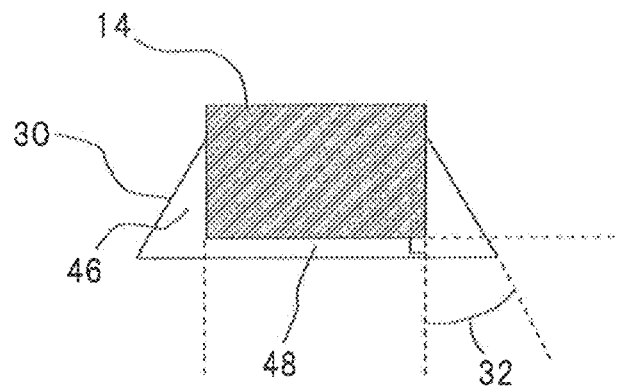
FIG. 3 is a schematic cross-section diagram illustrating a grown crystal which has enlarged the diameter from a seed crystal as an origin in an embodiment.
Figure 4:
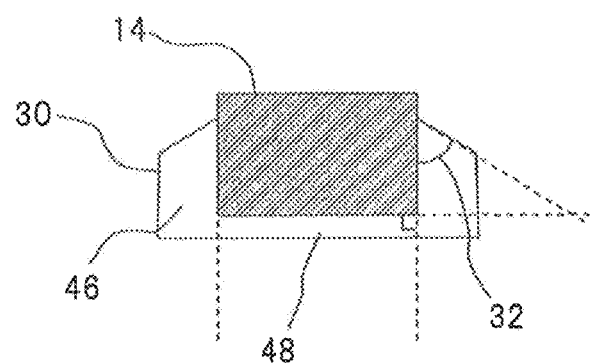
FIG. 4 is a schematic cross-section diagram illustrating a grown crystal which has enlarged the diameter from a seed crystal as an origin in another embodiment.

FIG. 3 and FIG. 4 show schematic cross-section diagrams of a grown crystal 30, of which the diameter has been enlarged from a seed crystal as an origin in an embodiment of the present invention. As shown in FIG. 3 and FIG. 4, a c-plane growth portion means a SiC single crystal in a region 48 directly beneath a seed crystal, grown from the seed crystal as an origin in the direction of the bottom surface (c-plane). As shown in FIG. 3 and FIG. 4, an enlarged diameter portion is a single crystal 46 grown in the direction of the side surface of a seed crystal from the seed crystal as an origin. A SiC grown crystal 30 means a single crystal including the c-plane growth portion 48 and the enlarged diameter portion 46.

Growth in the direction of the c-plane means growth in the direction perpendicular to the c-plane of a seed crystal (along the c-axis), and a crystal in the region 48 in FIG. 3 and FIG. 4 is grown. Growth in the direction of a non-c-plane means growth in the direction of a side surface of the seed crystal by enlarging the diameter at a predetermined angle, and a crystal in the enlarged diameter portion 46 in FIG. 3 and FIG. 4 is grown.

The area of a continuous region free of threading dislocations in a plane containing a seed crystal and an enlarged diameter portion and parallel to the c-plane occupies at least 50% or more of the total area of the plane, preferably 60% or more, more preferably 70% or more, more preferably 80% or more, and even more preferably 90% or more.

A grown crystal with an enlarged diameter containing a c-plane growth portion and an enlarged diameter portion can be obtained by epitaxial growth of SiC from simultaneously the c-plane ((0001) plane or (000-1) plane) and a non-c-plane (a-plane and m-plane) of a SiC seed crystal. A SiC single crystal can be effectively grown by that a SiC seed crystal with a bottom surface for causing c-plane growth, a top surface held by a graphite shaft, and side surfaces (non-c-plane (a-plane and m-plane)) is prepared and placed such that the bottom surface and the side surfaces of the seed crystal are contacted with a Si—C solution with a temperature gradient decreasing from the inside toward the surface in a crucible.

A SiC single crystal can easily form a growth shape with an enlarged diameter originated from a seed crystal not only by having the bottom surface of the seed crystal contacted with a Si—C solution, but also by having the Si—C solution wet the side surfaces of the seed crystal. A threading dislocation hardly propagates to an enlarged diameter portion in the direction perpendicular to the c-axis, even if threading dislocations are present in a seed crystal, since a threading dislocation may propagate in the direction perpendicular to the c-plane (in the direction parallel to the c-axis). Therefore, a SiC single crystal free of a threading dislocation can be obtained in an enlarged diameter portion.

An angle of enlarging the diameter of a grown crystal (hereinafter referred to as "diameter enlarging angle") is preferably 35 degrees to 90 degrees, more preferably 60 degrees to 90 degrees, and further preferably 78 to 90 degrees. The larger the diameter enlarging angle is, the larger an obtained enlarged diameter portion becomes, and therefore the area of continuous region free of threading dislocations can be produced more efficiently.

As shown in FIG. 3 and FIG. 4, the diameter enlarging angle is an angle included between the direction perpendicular to the bottom surface of a seed crystal and the top surface of a grown crystal, and particularly an enlarging angle with respect to a grown crystal at an early growth stage. FIG. 3 is a schematic cross-section diagram illustrating a case where a grown crystal grows linearly from side surfaces of a seed crystal with a constant diameter enlarging angle, while FIG. 4 is a schematic cross-section diagram illustrating a case where a grown crystal expands at an early growth stage with a large diameter enlarging angle, thereafter grows with a changed diameter enlarging angle. A large diameter enlarging angle is preferably used for obtaining a grown crystal with a large diameter. In general, a lower profile meniscus (closer to parallel to the Si—C solution surface) tends to give a larger diameter enlarging angle, and a higher profile meniscus (closer to perpendicular to the Si—C solution surface) tends to give a smaller diameter enlarging angle. The meniscus angle can be adjusted by changing the relative position of a seed crystal and a Si—C solution surface, so as to regulate the diameter enlarging angle. It is also possible to change the diameter enlarging angle by changing the height of the seed crystal from the Si—C solution surface for regulating the meniscus angle during growth of the SiC single crystal.

Figure 10:
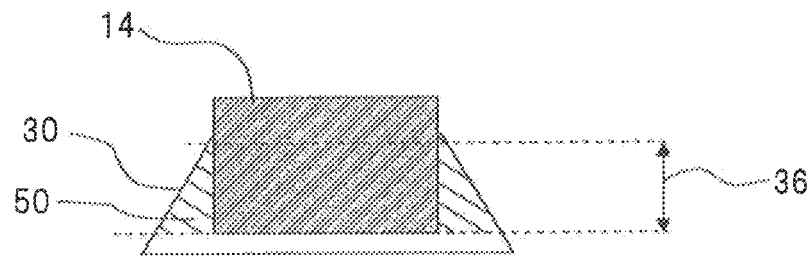
FIG. 10 is a schematic cross-section diagram illustrating a location of a plane for observing existence or nonexistence, etc. of threading dislocations in an embodiment.
Figure 11:
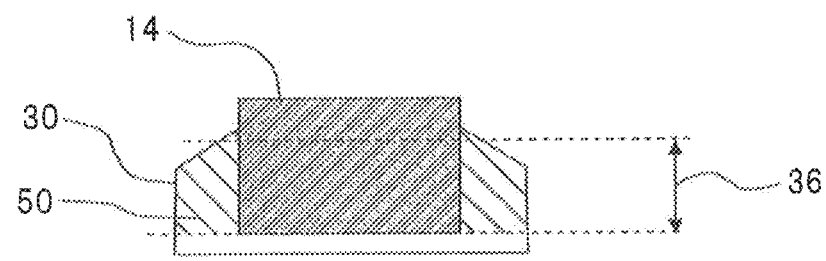
FIG. 11 is a schematic cross-section diagram illustrating a location of a plane for observing existence or nonexistence, etc. of threading dislocations in another embodiment.

FIG. 10 and FIG. 11 illustrate a location of a plane for observing existence or nonexistence of threading dislocations and measuring the area of a continuous region. The plane for observing existence or nonexistence of threading dislocations and measuring the area of a continuous region is a plane that is nearly parallel to the bottom surface (c-plane) of a seed crystal or the c-plane of a grown SiC single crystal and contains the seed crystal and an enlarged diameter portion. Existence or nonexistence of threading dislocations can be observed and the area of a continuous region free of threading dislocations can be measured in a plane that contains the seed crystal and the grown crystal and is parallel to the c-plane of the SiC single crystal, at an optional position within a region 36 of FIG. 10 or FIG. 11.

In an embodiment, a plane containing a seed crystal and an enlarged diameter portion may be exposed by grinding a SiC single crystal containing the seed crystal and the enlarged diameter portion nearly paralleled to the c-plane of the seed crystal from the top surface side of the seed crystal up to an optional position before reaching the bottom surface of the seed crystal. Since a SiC single crystal can have a shape with diameter enlargement according to the present invention, the enlarged diameter portion becomes larger and the area of a continuous region free of threading dislocations can be increased by approaching from the top surface closer to the bottom surface of a seed crystal. Consequently, in the region 36, the percentage of the area of a continuous region free of threading dislocations in a plane in the vicinity of the bottom surface of a seed crystal with respect to the total area of the plane tends to become maximum. Therefore, if the percentage of the area of a continuous region free of threading dislocations in a plane parallel to the c-plane at an optional position before reaching the bottom surface of the seed crystal within the region 36 with respect to the total area of the plane is measured to find 50% or more, a measurement in the vicinity of the bottom surface of the seed crystal is not necessarily required.

Figure 12:
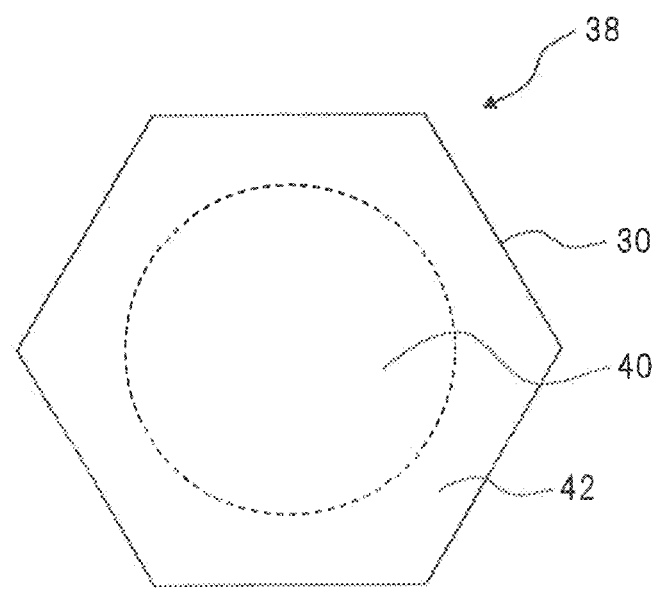
FIG. 12 is a schematic diagram of a plane that is parallel to the c-plane and contains a seed crystal and a grown crystal surrounding the same at an optional position within a region 36 in FIG. 10 or FIG. 11.

FIG. 12 is a schematic diagram of a plane 38 parallel to the c-plane at an optional position within the region 36 in FIG. 10 or FIG. 11, wherein the plane 38 includes a seed crystal and a grown crystal. In the plane, a region 40 in which threading dislocations may be present, and a continuous region 42 in which threading dislocations are absent, can be observed, and the percentage of the area of the continuous region 42 with respect to the total area of the plane can be measured.

In a plane shown in FIG. 12, the continuous region 42 free of threading dislocations can exist in a surrounding area of the central region 40 in which threading dislocations may be present. Generally, the central region 40 in which threading dislocations may be present, is a seed crystal region, and the continuous region 42 free of threading dislocations corresponds to an enlarged diameter portion. As a seed crystal, a SiC single crystal prepared by a sublimation process, etc., may be used, which may contain threading dislocations, but a surrounding enlarged diameter portion is free of threading dislocations. Defects may appear near the border between a seed crystal and a grown crystal, and even in such a case, a continuous region free of threading dislocations can be obtained in most parts of an enlarged diameter portion around the seed crystal. Preferably, the entire enlarged diameter portion does not contain threading dislocations.

In an embodiment, in a plane including a seed crystal and an enlarged diameter portion, the area of an enlarged diameter portion with respect to the total area of the plane including the seed crystal and the enlarged diameter portion occupies at least 50% or more, more preferably 60% or more, more preferably 70% or more, more preferably 80% or more, and even more preferably 90% or more.

In another embodiment, a SiC single crystal including a seed crystal with a c-plane and a non-c-plane, and a c-plane growth portion and an enlarged diameter portion that have grown from the c-plane and the non-c-plane of the seed crystal as origins in the direction of the c-plane and the direction of the non-c-plane, can be produced, wherein a continuous region not only free of threading dislocations, but also free of basal plane dislocations and stacking faults is present in a peripheral portion of a plane that is nearly parallel to the c-plane of the SiC single crystal and contains a c-plane growth portion and an enlarged diameter portion, and wherein the area of the continuous region occupies at least 50% or more of the total area of the plane. The percentage of the area of the continuous region with respect to the total area of the plane is more preferably 60% or more, more preferably 70% or more, more preferably 80% or more, and even more preferably 90% or more.

Figure 14:
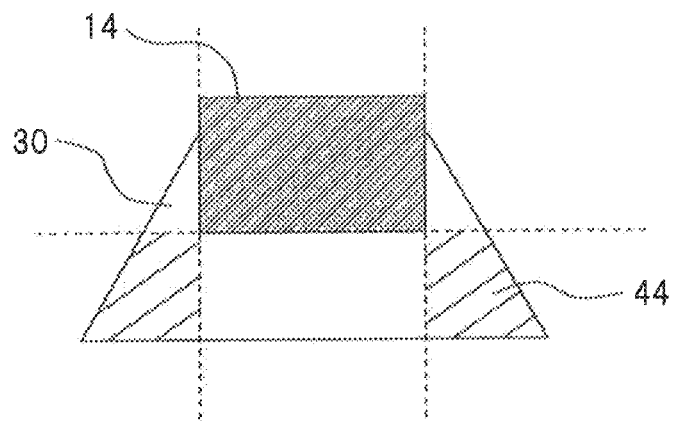
FIG. 14 is a schematic cross-section diagram illustrating the position of a grown crystal under the bottom surface of a seed crystal and in the enlarged diameter portion.
Figure 15:
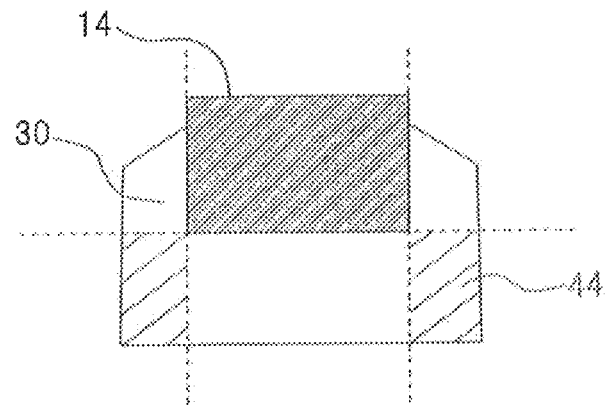
FIG. 15 is a schematic cross-section diagram illustrating the position of a grown crystal under the bottom surface of a seed crystal and in the enlarged diameter portion.

In the embodiment for producing a SiC single crystal with an enlarged diameter by using an ordinary seed crystal by a sublimation process, etc., as described above, a SiC single crystal with a region 44 which is lower than the bottom surface (c-plane) of the seed crystal (liquid surface side) and outside a part just beneath the c-plane of the seed crystal (enlarged diameter portion), and free of threading dislocations, basal plane dislocations, and stacking faults, can be produced by enlarging the diameter and continuing growth of the SiC single crystal, as shown in FIG. 14 and FIG. 15. Since the propagation direction of a threading dislocation from a seed crystal is in the direction parallel to the c-axis, and the propagation direction of a basal plane dislocation and a stacking fault is perpendicular to the c-axis, a high quality SiC single crystal can be effectively produced by growing the region 44, where the influences of both can be eliminated.

The diameter enlarging angle of a grown crystal is preferably 35 degrees to 90 degrees, more preferably 60 degrees to 90 degrees, and further preferably 78 to 90 degrees. The larger the diameter enlarging angle is, the larger a produced enlarged diameter portion becomes, and therefore a continuous region free of threading dislocations, basal plane dislocations, and stacking faults can be produced more efficiently.

In a preferable embodiment, a SiC single crystal containing a grown crystal grown from a seed crystal containing at least partly a continuous region free of threading dislocations as an origin, can be produced, wherein a continuous region free of threading dislocations, basal plane dislocations, and stacking faults is present at least in a peripheral portion of a plane parallel to the c-plane of the SiC single crystal, and the area of the continuous region occupies 50% or more of the total area of the plane. The percentage of the area of the continuous region with respect to the total area of the plane is more preferably 60% or more, more preferably 70% or more, more preferably 80% or more, and even more preferably 90% or more.

Figure 13:
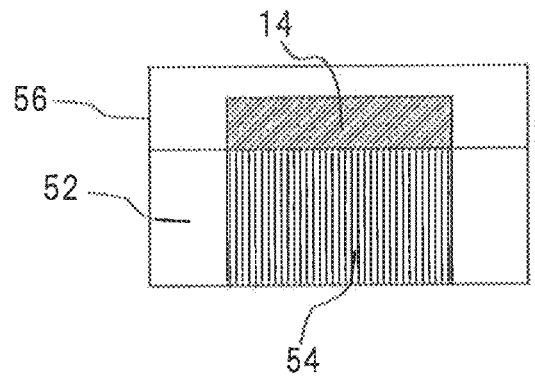
FIG. 13 is a schematic cross-section diagram illustrating a SiC single crystal further grown by using as a seed crystal a SiC single crystal free of threading dislocations in the peripheral portion obtained in an embodiment.

A continuous region 42 free of threading dislocations may be present in a plane that is nearly parallel to the c-plane of the SiC single crystal grown in the above embodiment and contains a seed crystal and an enlarged diameter portion. In a preferable embodiment, a wafer containing the continuous region 42 is sliced out and can be used as a seed crystal 56, placing the c-plane containing the continuous region 42 as the bottom surface, so as to carry out further c-plane growth of the SiC single crystal, as shown in FIG. 13. A grown crystal 52 directly beneath the continuous region 42 after c-plane growth from the continuous region 42 free of threading dislocations as an origin in this manner can be free of threading dislocations. Further, since basal plane dislocations and stacking faults can propagate parallel to the c-plane but not in the c-axis direction, the grown crystal 52 grown by the c-plane growth from the continuous region 42 as an origin can also be free of basal plane dislocations and stacking faults. Since there can be a continuous region free of not only threading dislocations but also of basal plane dislocations and stacking faults in a plane nearly parallel to the c-plane of a SiC single crystal grown in another embodiment and containing a c-plane growth portion and an enlarged diameter portion, the SiC single crystal can be used as a seed crystal.

The present invention also relates to a method of producing a SiC single crystal by a solution process, wherein a SiC seed crystal is contacted with a Si—C solution with a temperature gradient in which the temperature decreases from the inside toward the surface, allowing a single crystal to grow, wherein the seed crystal comprises a bottom surface placed in parallel to the surface of the Si—C solution, a top surface held by a graphite shaft, and side surfaces, wherein the method comprises contacting the bottom surface and the side surfaces of the seed crystal with the Si—C solution to form a meniscus between the side surfaces of the seed crystal and the Si—C solution, such that the graphite shaft is not contacted with the SiC solution; and growing a crystal from the seed crystal allowing the diameter to enlarge.

Figure 2:
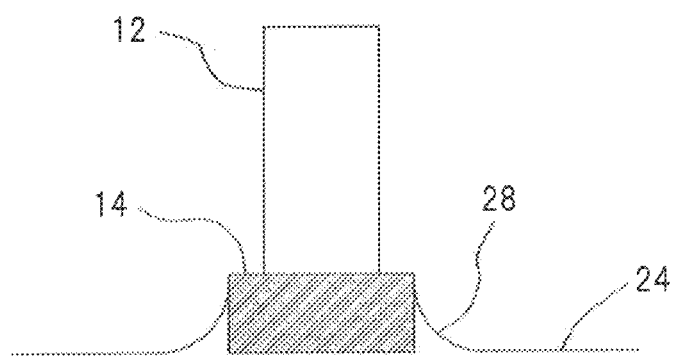
FIG. 2 is a schematic cross-section diagram illustrating the relationship between a seed crystal and a Si—C solution surface in the first embodiment.

In the present method, a Si—C solution is not only contacted with the bottom surface of a seed crystal, but also wets side surfaces of the seed crystal to form a meniscus between the side surfaces of the seed crystal and the Si—C solution to grow a SiC single crystal in order to simultaneously conduct epitaxial growth from the c-plane ((0001) plane or (000-1) plane) as the bottom surface of the seed crystal and the side surfaces of the seed crystal (non-c-plane (a-plane and m-plane)), as shown in FIG. 2. In this method, it is necessary to prevent the Si—C solution from touching a graphite shaft.

It has been discovered that epitaxial growth of a SiC single crystal can be simultaneously conducted from the bottom surface and side surfaces of the seed crystal, and that a high quality SiC single crystal containing extremely few threading dislocations can be produced by crystal growth with the diameter efficiently enlarging from the seed crystal as an origin. However, if a Si—C solution contacts a graphite shaft, a polycrystal is generated. Therefore, it has been found that it is important to prevent a Si—C solution from contacting a graphite shaft, while having the Si—C solution wet side surfaces of a seed crystal to form a meniscus. A meniscus means herein is a concave surface formed at a surface of a Si—C solution, which is wetting a side surface of a seed crystal by a surface tension, and "formation of a meniscus" means that a Si—C solution wets a side surface of a seed crystal.

A solution process is used in the present method of producing a SiC single crystal. In the solution process for producing a SiC single crystal, a seed crystal is contacted with the surface of a Si—C solution, in a crucible, with a temperature gradient, in which the temperature decreases from the inside toward the surface, so that the Si—C solution in the vicinity of the seed crystal is made supersaturated to grow a SiC single crystal on the seed crystal.

In the first embodiment of the present method, a SiC single crystal with a quality generally used for producing a SiC single crystal may be used as a seed crystal. For example, a SiC single crystal produced in a general manner by a sublimation process may be used as a seed crystal. Such a SiC single crystal produced in a general manner by a sublimation process usually contains many threading dislocations as well as basal plane dislocations and stacking faults.

A seed crystal used in the first embodiment has the c-plane which is the bottom surface of the seed crystal in parallel contact with a Si—C solution surface, a side surface including an angle of 90 degrees with the bottom surface or a side surface including an angle larger than 90 degrees with the bottom surface, and the top surface held by a graphite shaft. The bottom surface of the seed crystal is a plane whose offset angle from the c-plane is 0 to ±10 degrees, preferably 0 to ±5 degrees, further preferably 0 to ±2 degrees, and further preferably 0 to ±1 degrees, and is most preferably a plane parallel to the c-plane. Since a threading dislocation which may propagate from a seed crystal to a grown crystal, is formed perpendicular to the c-plane (parallel to the c-axis), the more the bottom surface of a seed crystal is parallel to the c-plane, the more generation of threading dislocations in an enlarged diameter portion can be suppressed. A side surface of a seed crystal used in the present invention is a non-c-plane and includes an a-plane and a m-plane, and is also referred to herein as side surface or a-plane, and they have the same meaning.

In the first embodiment, a large area SiC single crystal free of threading dislocations can be obtained in a grown crystal. A grown crystal not only grown by c-plane growth but also grown by diameter enlargement in the direction of a non-c-plane from a seed crystal as origins can be obtained, and an enlarged diameter portion grown at a large angle to the c-axis in the direction of a side surface can be obtained.

In the first embodiment, a SiC single crystal, in which, in a plane nearly parallel to the c-plane of a seed crystal and containing a seed crystal and an enlarged diameter portion, the area of the enlarged diameter portion occupies 50% or more of the total area of the plane, and the enlarged diameter portion is free of threading dislocations, can be produced.

As shown in FIG. 10 and FIG. 11, a plane containing a seed crystal and an enlarged diameter portion means a plane including an enlarged diameter portion appeared by grinding a SiC single crystal containing a seed crystal and an enlarged diameter portion nearly parallel to the c-plane of the seed crystal from the top surface of the seed crystal up to an optional position within a region 36 before reaching the bottom surface of the seed crystal. Since a grown SiC single crystal has a shape with an enlarged diameter, the area of an enlarged diameter portion can be increased as approaching the bottom surface of the seed crystal when it is ground from the top surface of the seed crystal. Thus, the percentage of the area of the enlarged diameter portion tends to become maximum in a plane in the vicinity of the bottom surface of the seed crystal. Therefore, if the percentage of the area of an enlarged diameter portion is measured to find 50% or more in a plane at an optional position within the region 36 before reaching the bottom surface of the seed crystal, a measurement in the vicinity of the bottom surface is not necessarily required. Although defects may be generated near the border between a seed crystal and an enlarged diameter portion, the larger the area of an enlarged diameter portion is, the larger the area of a region free of threading dislocations can be made, since the enlarged diameter portion generally does not contain threading dislocations.

It is preferable that the area of an enlarged diameter portion in a plane containing a seed crystal and an enlarged diameter portion is as large as possible, and it occupies at least 50% or more of the total area of a plane of a SiC single crystal containing a seed crystal and an enlarged diameter portion, more preferably 60% or more, more preferably 70% or more, more preferably 80% or more, and even more preferably 90% or more.

In the first embodiment, by continuing further growth of the single crystal, a SiC single crystal in which a grown crystal is not only free of threading dislocations but also free of basal plane dislocations and stacking faults, can be obtained.

As shown in FIGS. 14 and 15, by continuing growth of a SiC single crystal while enlarging the diameter, a region 44 which is under (liquid surface side) the bottom surface (c-plane) of a seed crystal and outside the seed crystal just beneath the c-plane (enlarged diameter portion), can be formed. Since the propagation direction of a threading dislocation from a seed crystal is parallel to the c-axis, and the propagation direction of a basal plane dislocation and a stacking fault is perpendicular to the c-axis, influences of both the propagations can be eliminated in the region 44, and a SiC single crystal free of threading dislocations, basal plane dislocations, and stacking faults can be produced.

In this case, in a plane parallel to the c-plane of a SiC single crystal and containing the region 44 of an enlarged diameter portion, a continuous region free of threading dislocations, basal plane dislocations, and stacking faults is present in a peripheral portion of the plane. The area of the continuous region can occupy 50% or more of the total area of the plane, preferably 60% or more, more preferably 70% or more, more preferably 80% or more, and even more preferably 90% or more.

Examination of existence or nonexistence of threading dislocations can be conducted by mirror-polishing a grown crystal parallel to the c-plane so as to expose the (0001) plane where a dislocation is detectable, etching the polished surface with molten potassium hydroxide, etc., to emphasize a dislocation, and then observing the surface of the SiC single crystal under a microscope.

Examination of not only threading dislocations but also basal plane dislocations and stacking faults can be conducted by exposing a plane inclined at a predetermined angle to the c-plane by grinding, etching the polished surface with molten potassium hydroxide, etc., to emphasize a dislocation and a defect, and then observing the same under a microscope.

The diameter enlarging angle is preferably 35 degrees to 90 degrees, more preferably 60 degrees to 90 degrees, and further preferably 78 to 90 degrees. Since a larger enlarged diameter portion can be produced with a larger diameter enlarging angle, a high quality SiC single crystal free of threading dislocations can be more efficiently produced with the larger diameter enlarging angle. As shown in FIG. 3 and FIG. 4, the diameter enlarging angle means an angle between the direction perpendicular to the bottom surface of a seed crystal and the top surface of a grown crystal. FIG. 3 is a schematic cross-section diagram illustrating a case where a grown crystal grows linearly from side surfaces of a seed crystal. FIG. 4 is a schematic cross-section diagram illustrating a case where a grown crystal grows with a changing expansion angle from side surfaces of a seed crystal.

The height of wetting of a Si—C solution on to a side surface of a seed crystal may depend on the thickness of the seed crystal, the shape of the same, the immersion depth of the same in the Si—C solution, etc.

Figure 5:
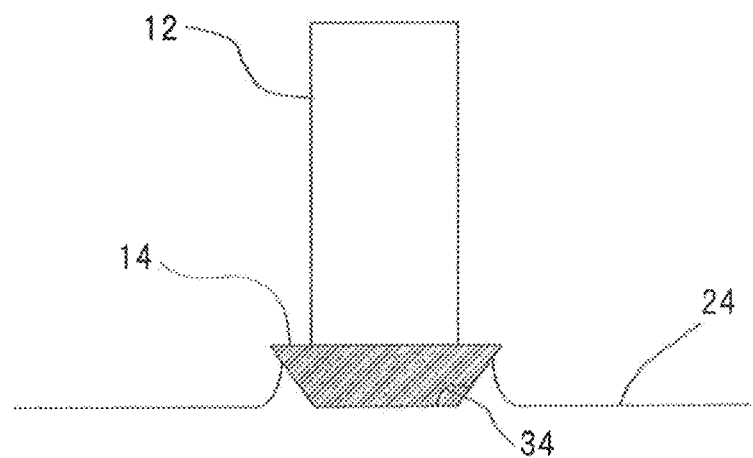
FIG. 5 is a schematic cross-section diagram illustrating the relationship between a seed crystal and a Si—C solution surface in another embodiment.

The shape of a seed crystal used in the first embodiment may be disk-shaped, cylindrical, prismatic or the like, which has an angle of 90 degrees between the bottom surface and the side surface of the seed crystal (hereinafter referred to as "bottom surface/side surface angle"), or may be truncated cone-shaped or truncated pyramid-shaped, whose bottom surface/side surface angle is larger than 90 degrees. As shown in FIG. 5, the bottom surface/side surface angle means herein the angle 34 between the bottom surface and the side surface of a seed crystal.

In the case of a disk-shaped, cylindrical, or prismatic seed crystal with the bottom surface/side surface angle of 90 degrees, preparation of a seed crystal specimen is relatively easy, and a grown crystal with an enlarged diameter by virtue of c-plane and a-plane growth can be produced by forming a meniscus that a Si—C solution wets side surfaces of the seed crystal. A truncated cone-shaped or truncated pyramid-shaped seed crystal with the bottom surface/side surface angle larger than 90 degrees can be prepared by cutting or grinding a disk-shaped, cylindrical, or prismatic seed crystal. The bottom surface/side surface angle is preferably from 90 degrees to 155 degrees. Generally, a larger diameter enlarging angle of a grown crystal can be easily obtained when a seed crystal has a larger bottom surface/side surface angle. However, if the bottom surface/side surface angle of a seed crystal is too large, a-plane growth may become difficult.

The thickness of a seed crystal used in the first embodiment is preferably 0.5 mm or more, more preferably 1 mm or more, so that a Si—C solution can wet side surfaces of the seed crystal to effectively perform a-plane growth. Although there is no particular upper limit on the thickness of a seed crystal, a seed crystal having the thickness of 15 mm or less is preferable from a practical perspective. For example, a seed crystal with the thickness of 1 to 5 mm may be used.

A seed crystal can be mounted on a single crystal production apparatus by holding the top surface of the seed crystal with a graphite shaft, as described above.

A seed crystal can be contacted with a Si—C solution by lowering a graphite shaft holding the seed crystal toward the Si—C solution surface so that the bottom surface of the seed crystal is positioned parallel to the Si—C solution surface and contacted with the Si—C solution. The seed crystal is placed to a predetermined position with respect to the Si—C solution surface, so that the Si—C solution wets side surfaces of the seed crystal in addition to the bottom surface of the seed crystal.

A seed crystal may be held at a position where the bottom surface of the seed crystal can be contacted with the Si—C solution, the Si—C solution can wet the side surfaces of the seed crystal, and the graphite shaft can be prevented from contacting the Si—C solution. A seed crystal may be positioned such that the position of the bottom surface of the seed crystal is identical with the Si—C solution surface, lower than the Si—C solution surface, or higher than the Si—C solution surface. When the bottom surface of a seed crystal is held at a position higher than the Si—C solution surface, it is preferable that the seed crystal is contacted with the Si—C solution and the Si—C solution wets side surfaces of the seed crystal while keeping the contact between the bottom surface of the seed crystal and the Si—C solution, and then the seed crystal is pulled up. In the present invention, it is preferable that the position of the bottom surface of a seed crystal be identical with the Si—C solution surface or lower than the Si—C solution surface, such that the Si—C solution wets side surfaces of the seed crystal. In the methods, the position of a seed crystal may be adjusted during growth of a single crystal.

A graphite shaft is a shaft of graphite for holding a seed crystal substrate at an edge face, and may be in an optional shape, such as cylindrical and prismatic. A graphite shaft having an edge face shape identical with the top surface shape of a seed crystal may be used. A graphite shaft, in which the maximum diameter of the graphite shaft at a part holding a seed crystal is less than the minimum diameter of the top surface of the seed crystal, may be used in order to prevent Si—C solution from contacting the graphite shaft. By using a graphite shaft in which the maximum diameter of the edge face holding a seed crystal is smaller than the minimum diameter of the top surface of the seed crystal, a Si—C solution can stop easily at the top of a side surface of the seed crystal due to a surface tension even when the Si—C solution wets the side surface of the seed crystal, and the control against the contact of the Si—C solution to the graphite shaft becomes easy.

When the angle between the side surface and the top surface of a seed crystal is 90 degrees or less, a Si—C solution can stop more easily at the top of the side surface of the seed crystal even if the Si—C solution wets the side surface and rises to the top, and the Si—C solution can be more easily prevented from contacting a graphite shaft.

In the second embodiment of the present invention, a SIC single crystal grown by the method of producing a SiC single crystal according to the first embodiment is used as a seed crystal and a SiC single crystal can be further grown. In this case, as shown in FIG. 10 or FIG. 11, a wafer of a single crystal which includes a plane parallel to the c-plane and containing an enlarged diameter portion 50, which is an enlarged diameter portion grown higher than the bottom surface of the seed crystal, in the SiC single crystal grown according to the first embodiment, can be sliced out and used as a seed crystal.

In other words, the c-plane of a SiC wafer, which is sliced out in a plane parallel to the c-plane at an optional position within the region 36 containing the seed crystal 14 and the enlarged diameter portion 50, can be utilized as the bottom surface of a seed crystal for the next step for further growing a SiC single crystal. A continuous region 42 free of threading dislocations may be present in the sliced-out c-plane.

As shown in FIG. 13, c-plane growth of a SiC single crystal can be further performed by using the c-plane in which a continuous region 42 is present in the peripheral portion as the bottom surface of a seed crystal 56. A grown crystal 52 just beneath the continuous region 42 grown by c-plane growth from the continuous region 42 as an origin, does not contain threading dislocations. Further, a basal plane dislocation and a stacking fault can propagate in parallel to the c-plane of the seed crystal 56, but cannot propagate in the c-axis direction, and therefore, the grown crystal 52 grown by c-plane growth from the continuous region 42 as an origin does not contain basal plane dislocations and stacking faults either.

As shown in FIG. 12, a continuous region 42 free of threading dislocations may be present in the c-plane of a SiC wafer. As shown in FIG. 13, c-plane growth of a SiC single crystal can be further performed by using the c-plane in which the continuous region 42 is present in the peripheral portion as the bottom surface of a seed crystal 56. A grown crystal 52 just beneath the continuous region 42 grown by c-plane growth from the continuous region 42 as an origin, does not contain threading dislocations. Further, a basal plane dislocation and a stacking fault can propagate in parallel to the c-plane of the seed crystal 56, but cannot propagate in the c-axis direction, and therefore, the grown crystal 52 grown by c-plane growth from the continuous region 42 as an origin does not contain basal plane dislocations and stacking faults either.

A single crystal produced in the second embodiment can contain a region free of not only threading dislocations, but also of basal plane dislocations and stacking faults. The region free of threading dislocations, basal plane dislocations, and stacking faults is present in a peripheral portion in a plane nearly parallel to the bottom surface (c-plane) of the seed crystal, and the area of the continuous region is at least 50% or more of the total area of the plane, more preferably 60% or more, more preferably 70% or more, more preferably 80% or more, and even more preferably 90% or more.

A SiC single crystal grown according to the second embodiment can be further used as a seed crystal for growing a SiC single crystal which may be further repeated.

As a seed crystal used in the second embodiment, only an enlarged diameter portion 50 free of threading dislocations in a SiC single crystal grown according to the first embodiment may be cut out and used. In this case, the percentage of the area of a continuous region free of threading dislocations, basal plane dislocations, and stacking faults in a single crystal grown according to the second embodiment can be substantially 100%.

In the third embodiment of the present invention, as shown in FIG. 14 or FIG. 15, a single crystal wafer with a plane parallel to the c-plane and containing a part 44 which is an enlarged diameter portion of a SiC single crystal grown by the method according to the first embodiment and grown below the bottom surface of a seed crystal, can be sliced out and used as a seed crystal.

The c-plane of the sliced-out single crystal can be used as the bottom surface of a seed crystal for the next step, so as to further grow a SiC single crystal. Since a single crystal in a part 44 grown below the bottom surface of a seed crystal can be made substantially free of threading dislocations as well as basal plane dislocations and stacking faults which propagate from the c-plane and a-plane of the seed crystal, a continuous region free of threading dislocations, basal plane dislocations, and stacking faults can be present in the sliced-out c-plane, as the continuous region 42 in FIG. 12.

C-plane growth of a SiC single crystal can be further performed by using the c-plane in which a continuous region free of dislocations and defects is present in the peripheral portion, as the bottom surface of a seed crystal, in the same way as the embodiment shown in FIG. 13. A grown crystal just beneath the continuous region, grown by c-plane growth from the continuous region as an origin, does not contain threading dislocations, basal plane dislocations, and stacking faults. In this manner, a high quality SiC single crystal free of threading dislocations as well as basal plane dislocations and stacking faults can be produced.

Although a basal plane dislocation and a stacking fault may be generated in the direction parallel to the c-plane (in the direction perpendicular to the c-axis), a defect may be also generated in the direction of the c-axis near the border between a seed crystal and a grown crystal. Therefore, a single crystal which includes an enlarged diameter portion grown below the bottom surface of the seed crystal and apart from the bottom surface of the seed crystal preferably by 10 μm or more, and more preferably by 50 μm or more, may be preferably cut out and used as a seed crystal.

With respect to a crystal grown in the third embodiment, the region free of threading dislocations, basal plane dislocations, and stacking faults is present in a peripheral portion in a plane nearly parallel to the bottom surface (c-plane) of the seed crystal, and the area of the continuous region is at least 50% or more of the total area of the plane, more preferably 60% or more, more preferably 70% or more, more preferably 80% or more, and even more preferably 90% or more.

A SiC single crystal grown according to the third embodiment can be further used as a seed crystal for growing a SiC single crystal which may be further repeated.

As a seed crystal used in the third embodiment, only an enlarged diameter portion 50 free of threading dislocations in a SiC single crystal grown according to the first embodiment may be cut out and used. In this case, the percentage of the area of a continuous region free of threading dislocations, basal plane dislocations, and stacking faults in a single crystal grown according to the third embodiment can be substantially 100%.

A Si—C solution herein is a solution using melted Si or melted Si/X (X is one or more types of metals other than Si) as a solvent dissolving C. There is no particular restriction on X, insofar as X is one or more types of metals, and is able to form a liquid phase (solution) in a thermodynamic equilibrium with SiC (solid phase). Examples of an appropriate metal X include Ti, Mn, Cr, Ni, Ce, Co, V, and Fe. For example, a Si—Cr solution, a Si—Cr-Ni solution, etc., can be formed by disposing Si, as well as Cr, Ni, etc., in a crucible.

As for a Si—C solution, the surface temperature is preferably 1800 to 2200° C. where the dissolution amount of C in a Si—C solution fluctuates little.

The temperature of a Si—C solution can be measured by a thermocouple, a radiation thermometer, etc. With respect to a thermocouple, a thermocouple with tungsten-rhenium strands coated with zirconia or magnesia glass and inserted in a graphite protecting tube is preferable from viewpoints of high temperature measurement and prevention of impurities from mixing.

Figure 1:
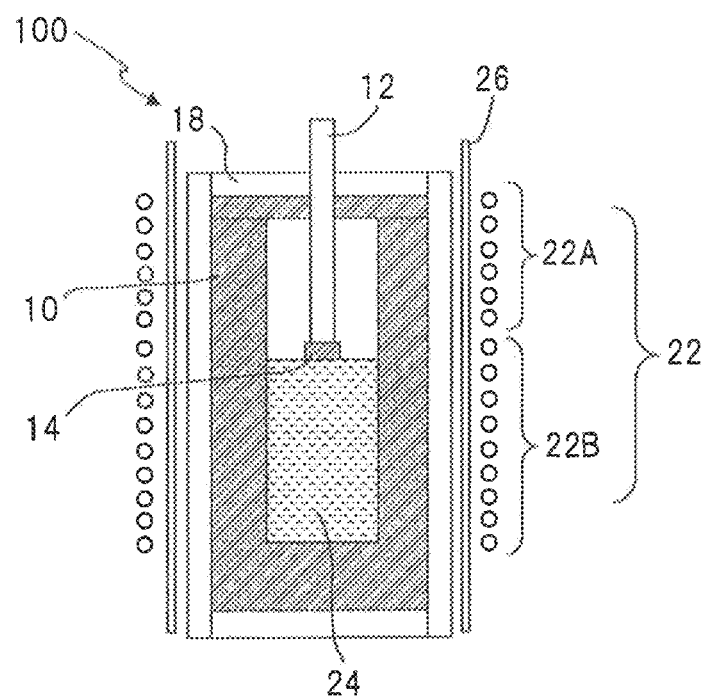
FIG. 1 is a schematic cross-section diagram of a single crystal production apparatus used in the present invention.

FIG. 1 shows an example of a SiC single crystal production apparatus suitable for performing the method according to the present invention. The SiC single crystal production apparatus 100 shown in FIG. 1 includes a crucible 10 and a vertically movable graphite shaft 12, wherein the crucible 10 contains a Si—C solution 24 in which C is dissolved in melted Si or melted Si/X, the Si—C solution 24 forms a temperature gradient decreasing from the inside of the Si—C solution toward the solution surface, and the vertically movable graphite shaft 12 holds, at an end, a seed crystal substrate 14, which is contacted with the Si—C solution 24 to form a meniscus by wetting the Si—C solution 24 on to side surfaces of the seed crystal substrate 14, so that a SiC single crystal can be grown. Preferably, the crucible 10 and the graphite shaft 12 are rotated.

The Si—C solution 24 is prepared by disposing source materials in a crucible, melting them by heating to prepare melted Si or melted Si/X, and dissolving C therein. A carbonaceous crucible such as a graphite crucible, or a SiC crucible, can be used as the crucible 10 to form a Si—C solution with C dissolved from the crucible 10 dissolving into the melt. In this manner, there is no undissolved C in the Si—C solution 24, and wasting of SiC by deposit of a SiC single crystal on undissolved C can be prevented. For C supply, for example, a hydrocarbon gas may be blown in, or a solid C supply source may be disposed together with other melt source materials, or a combination of any of such methods and crucible dissolution may be applied.

The outside of the crucible 10 is covered by a heat insulating material 18 for thermal insulation. The overall equipment is contained in a quartz tube 26. The high-frequency coil 22 for heating is placed along the outer circumference of the quartz tube 26. The high-frequency coil 22 may be configured with an upper coil 22A and a lower coil 22B. The upper coil 22A and the lower coil 22B can be regulated independently.

Since the temperatures of the crucible 10, the heat insulating material 18, the quartz tube 26, and the high-frequency coil 22 become high, they are placed in a water-cooling chamber. The water-cooling chamber is provided with a gas feed port and a gas exhaust port for controlling the internal atmosphere inside the apparatus.

With respect to the temperature of a Si—C solution, there is generally a temperature distribution, in which the surface temperature is lower than the temperature inside the Si—C solution due to radiation, etc. Further, a predetermined temperature gradient can be formed in a direction perpendicular to the surface of the Si—C solution 24 so that the temperature at an upper portion of the solution where the seed crystal substrate 14 is immersed in the Si—C solution 24, becomes low, and the temperature at a lower portion of the solution becomes high, by adjusting number of turns and spacing of the high-frequency coil 22, a positional relationship between the high-frequency coil 22 and the crucible 10 in the height direction, and the power of the high-frequency coil. For example, by applying lower power to the upper coil 22A than to the lower coil 22B, a predetermined temperature gradient in which the temperature at an upper portion of the solution is low and the temperature at a lower portion of the solution is high, can be formed in the Si—C solution 24. The temperature gradient in a 2 to 3 mm-range from the solution surface is preferably 50° C./cm or less, and more preferably 40° C./cm or less.

The C dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the upper part and the lower part of the coil 22, heat dissipation from the Si—C solution surface, and heat extraction through the graphite shaft 12. When C dissolved in a lower portion of the solution where the temperature and the solubility are high, reaches near the bottom surface of the seed crystal where the temperature and the solubility are low, a supersaturation state appears and a SiC single crystal is grown on the seed crystal substrate by virtue of supersaturation as a driving force.

In some embodiments, meltback may be performed prior to growth of a SiC single crystal, namely a surface layer of a SiC seed crystal substrate may be removed by dissolving the same in a Si—C solution. Since an affected layer such as a dislocation, a natural oxide layer, or the like may be present in a surface layer of a seed crystal substrate for growing a SiC single crystal, removal of the same by dissolution prior to growth of a SiC single crystal is effective for growing a high quality SiC single crystal. Although the thickness of a layer to be removed depends on processed conditions of the surface of a SiC seed crystal substrate, it is preferably approximately 5 to 50 μm for sufficient removal of an affected layer and a natural oxide layer.

The meltback can be performed by forming a temperature gradient in which the temperature increases from the inside of a Si—C solution toward the solution surface, namely by forming, in a Si—C solution, a temperature gradient in a direction opposite to the case of SiC single crystal growth. The temperature gradient in the opposite direction can be formed by regulating the power of the high-frequency coil.

The meltback can also be conducted, without forming a temperature gradient in a Si—C solution, by simply immersing a seed crystal substrate in a Si—C solution heated to a temperature higher than a liquidus temperature. In this case, the higher the Si—C solution temperature is, the higher the dissolving speed becomes, but control of a dissolved amount also becomes difficult. If the temperature is low, the dissolving speed may become low.

In some embodiments, a seed crystal substrate may be preheated in advance, and then the same is contacted with a Si—C solution. If a low temperature seed crystal substrate is contacted with a high temperature Si—C solution, thermal shock dislocations may be generated in the seed crystal. Preheating of a seed crystal substrate before the contact of the same with a Si—C solution is effective for avoiding thermal shock dislocations and growing a high quality SiC single crystal. A seed crystal substrate may be heated together with a graphite shaft. Alternatively, a seed crystal is contacted with a Si—C solution having relatively low temperature, and then the Si—C solution may be heated to a temperature for growing a crystal. This method is also effective for avoiding thermal shock dislocations and growing a high quality SIC single crystal.

EXAMPLES

Example 1

A disk-shaped 4H—SiC single crystal with thickness of 1 mm, diameter of 12 mm, and bottom surface/side surface angle of 90 degrees, which bottom surface had the offset angle of 0 degree with respect to the c-plane, was prepared and used as a seed crystal substrate. The top surface of the seed crystal substrate was bonded with a graphite adhesive nearly at a center of an edge face of a graphite shaft in a cylindrical shape with length 20 cm and diameter 9 mm, such that the edge face of the graphite shaft did not protrude from the top surface of the seed crystal, but was contained in the top surface of the seed crystal.

A single crystal production apparatus shown in FIG. 1 was used, and Si/Cr/Ni/Ce were disposed, as melt source materials at a percentage atomic composition of 50/40/4/6, in a graphite crucible with inner diameter of 40 mm and height of 185 mm for accommodating a Si—C solution. An internal air of the single crystal production apparatus was replaced with argon. Power was applied to a high-frequency coil for heating to melt the source materials in the graphite crucible to prepare a melted Si/Cr/Ni/Ce alloy. Then, a sufficient amount of C was allowed to dissolve from the graphite crucible in the melted Si/Cr/Ni/Ce alloy to prepare a Si—C solution.

The powers of an upper coil and a lower coil was regulated to heat the graphite crucible, and the temperature at the surface of the Si—C solution was increased to 1820° C. The seed crystal was then contacted with the Si—C solution, keeping the bottom surface of the seed crystal bonded to the graphite shaft in parallel to the Si—C solution surface, such that the bottom surface of the seed crystal was placed at a position identical with the liquid surface of the Si—C solution, allowing the Si—C solution to wet side surfaces of the seed crystal.

Further, the temperature at the Si—C solution surface was raised to 1920° C., and a temperature gradient was so regulated that the temperature decreased from the inside of the Si—C solution toward the solution surface at 1° C./mm within a range of 2 mm from the solution surface. A temperature measurement was carried out by using a vertically movable thermocouple with tungsten-rhenium strands inserted in a graphite protecting tube.

The seed crystal was contacted with the Si—C solution, keeping the bottom surface of the seed crystal bonded to the graphite shaft in parallel to the Si—C solution surface, such that the seed crystal bottom surface was placed at a position identical with the liquid surface of the Si—C solution, allowing the Si—C solution to wet side surfaces of the seed crystal. A crystal was grown for 10 hours while maintaining a meniscus. Although the Si—C solution wetted side surfaces of the seed crystal and rose to the upper edge of the side surfaces, the Si—C solution did not touch the graphite shaft.

Figure 6:
FIG. 6 is a photograph of external appearance observed from the side of a SiC single crystal grown in the Example.

After completing the crystal growth, the graphite shaft was elevated and a SiC single crystal including the seed crystal and a crystal grown from the seed crystal as an origin was severed from the Si—C solution and the graphite shaft and was recovered. The crystal growth amount perpendicular to the bottom surface of the seed crystal was 0.8 mm, and a hexaprismatic SiC single crystal having a diameter enlargement grown to a diameter of 18 mm was obtained. The diameter of a grown crystal means herein the diameter of an inscribed circle of the surface of the grown crystal on the liquid surface side. The diameter enlarging angle of the grown crystal prepared in the present Example was 78 degrees. FIG. 6 is a photograph of the grown crystal observed from the side.

Example 2

A crystal was grown in the same way as Example 1 except that a rectangular box-shaped SiC single crystal having thickness of 5 mm and 6 mm×7 mm was used as a seed crystal substrate, and a cylindrical shape graphite shaft with length 20 cm and diameter 12 mm was used as a graphite shaft. During crystal growth, the Si—C solution wetted side surfaces of the seed crystal and rose to a height of 2 mm from the bottom surface of the seed crystal, but did not reach the graphite shaft.

Figure 7:
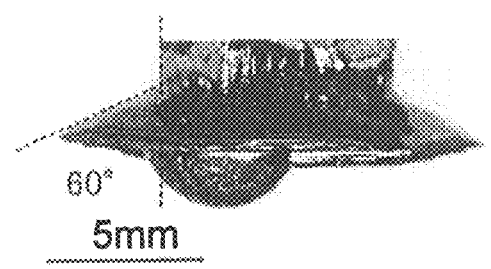
FIG. 7 is a photograph of external appearance observed from the side of a Sic single crystal grown in the Example.

The crystal growth amount perpendicular to the bottom surface of the seed crystal was 0.8 mm, and a SIC single crystal having a diameter enlargement grown to a diameter of 13 mm was obtained. The diameter enlarging angle of the grown crystal was 60 degrees. FIG. 7 is a photograph of the grown crystal observed from the side.

Example 3

A crystal was grown in the same way as Example 1 except that a disk-shaped SiC single crystal with thickness 2 mm and diameter 16 mm was polished with an abrasive liquid containing diamond grains to prepare a truncated cone-shaped crystal with thickness of 2 mm, bottom surface (liquid surface side) diameter of 7.7 mm, top surface (graphite shaft bond side) diameter of 16 mm, and bottom surface/side surface angle of 155 degrees, the prepared truncated cone-shaped crystal was used as a seed crystal substrate, a cylindrical shaped graphite shaft with length of 20 cm and diameter of 12 mm was used as a graphite shaft, and a crystal was grown for 24 hours. During crystal growth, the Si—C solution wetted side surfaces of the seed crystal and rose to a height of 2 mm from the bottom surface of the seed crystal, but the Si—C solution did not touch the graphite shaft.

Figure 8A:
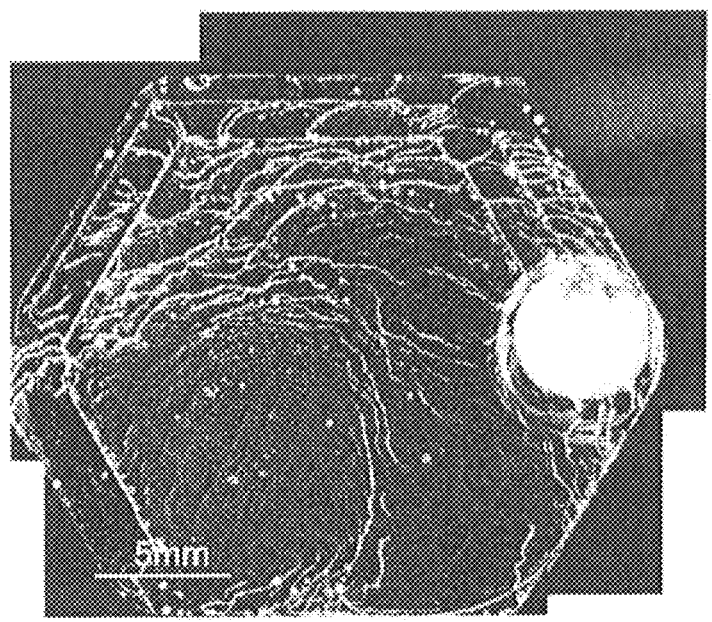
FIG. 8A is a microphotograph observed from the bottom side of a SiC single crystal grown in the Example.
Figure 8B:
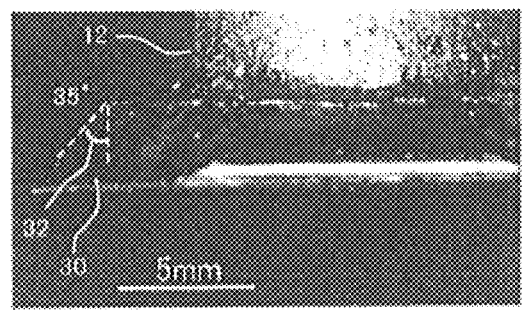
FIG. 8B is a photograph of external appearance observed from the side of a SiC single crystal grown in the Example.

The crystal growth amount perpendicular to the bottom surface of the seed crystal was 1.4 mm, and a SiC single crystal having a diameter enlargement grown to a diameter of 24 mm was obtained. The diameter enlarging angle of the grown crystal was 35 degrees. FIG. 8A is a photograph of the SiC single crystal observed from the bottom (liquid surface side), and FIG. 8B is a photograph of the SiC single crystal observed from the side.

Example 4

A crystal was grown in the same way as Example 1 except that a disk-shaped SiC single crystal with thickness of 1 mm and diameter of 12 mm was polished with an abrasive liquid containing diamond grains to prepare a truncated cone-shaped crystal with thickness of 1 mm, bottom surface (liquid surface side) diameter of 11.3 mm, top surface (graphite shaft bond side) diameter of 12 mm, and bottom surface/side surface angle of 110 degrees, the prepared truncated cone-shaped crystal was used as a seed crystal substrate, and a cylindrical shaped graphite shaft with length of 20 cm and diameter of 12 mm was used as a graphite shaft. The Si—C solution wetted side surfaces of the seed crystal and rose to a height of 1 mm from the bottom surface of the seed crystal, but the Si—C solution did not touch the graphite shaft.

The growth amount perpendicular to the bottom surface of the seed crystal was 1.6 mm, and a SiC single crystal having a diameter enlargement grown to a diameter of 18 mm was obtained. The diameter enlarging angle of the grown crystal was 90 degrees.

Example 5

A crystal was grown in the same way as Example 1 except that a disk-shaped SiC single crystal with thickness 1 mm and diameter 12 mm was polished with an abrasive liquid containing diamond grains to prepare a truncated cone-shaped crystal with thickness of 1 mm, bottom surface (liquid surface side) diameter of 10 mm, top surface (graphite shaft bond side) diameter of 12 mm, and bottom surface/side surface angle of 134 degrees, the prepared truncated cone-shaped crystal was used as a seed crystal substrate, and a cylindrical shaped graphite shaft with length of 20 cm and diameter of 12 mm was used as a graphite shaft. The Si—C solution rose to a height of 1 mm from the bottom surface of the seed crystal, but the Si—C solution did not touch the graphite shaft.

The growth amount perpendicular to the bottom surface of the seed crystal was 1.5 mm, and a SiC single crystal having a diameter enlargement grown to a diameter of 20 mm was obtained. The diameter enlarging angle of the grown crystal was 90 degrees.

Comparative Example 1

A crystal was grown in the same way as Example 1 except that a graphite shaft provided with a seed crystal was lowered to contact only the bottom surface of the seed crystal with the Si—C solution and the graphite shaft was then elevated immediately to place the same at a position of 1.5 mm above the liquid surface of the Si—C solution so that only the bottom surface of the seed crystal was kept wetted with the Si—C solution but the side surfaces of the seed crystal were kept not wetted with the Si—C solution.

The growth amount perpendicular to the bottom surface of the seed crystal was 1.0 mm, but the diameter of the grown SiC single crystal was 12 mm, and there was substantially no diameter enlargement in the grown crystal.

Comparative Example 2

A crystal was grown in the same way as Example 1 except that a cylindrical shaped graphite shaft with length of 20 cm and diameter of 12 mm was used as the graphite shaft.

The SiC solution wetted the side surfaces of the seed crystal to reach the graphite shaft. As the result, a polycrystal was generated and a SiC single crystal was not obtained.

Table 1 indicates the applied conditions and the data on the grown crystals obtained in the respective Examples.

TABLE 1

|  | Bottom surface/ side surface angle (degree) | Seed crystal thickness (mm) | Seed crystal diameter (mm) liquid surface side/shaft side | Graphite shaft diameter (mm) | Si—C solution wetting side surface/ Contact with graphite shaft | Crystal diameter after growth (mm) | Vertical crystal growth amount (mm) | Diameter enlarging angle (degree) |
|---|---|---|---|---|---|---|---|---|
| Example 1 | 90 | 1 | 12φ/12φ | 9φ | Yes/No | 18 | 0.8 | 78 |
| Example 2 | 90 | 5 | 6 × 7/6 × 7 | 12φ | Yes/No | 13 | 0.8 | 60 |
| Example 3 | 155 | 2 | 7.7φ/16φ | 12φ | Yes/No | 24 | 1.4 | 35 |
| Example 4 | 110 | 1 | 11.3φ/12φ | 12φ | Yes/No | 18 | 1.6 | 90 |
| Example 5 | 134 | 1 | 10φ/12φ | 12φ | Yes/No | 20 | 1.5 | 90 |
| Comparative Example 1 | 90 | 1 | 12φ/12φ | 12φ | No/No | 12 | 1.0 | — |
| Comparative Example 2 | 90 | 1 | 12φ/12φ | 12φ | Yes/Yes | — | — | — |

SiC single crystals obtained in Examples 1 to 5 were ground from the top surface side of the seed crystal in parallel to the c-plane of the seed crystal to remove 0.1 mm for Examples 1, 4, and 5, 3.1 mm for Example 2, and 1.0 mm for Example 3 in order to expose the (0001) plane in which a dislocation can be detected by etching, followed by buffing the (0001) plane with an abrasive liquid containing diamond grains having the grain size of 1 μm, as a final polishing, to expose a plane containing a seed crystal and an enlarged diameter portion. A sample was then dipped in 510° C.-molten potassium hydroxide for 4 min to be etched, and a dislocation was detected by observation under a metallographic microscope.

It was confirmed that a threading dislocation is not present in the enlarged diameter portion in the plane containing the seed crystal and the enlarged diameter portion of SiC single crystals obtained in Examples 1 to 5.

Figure 9A:
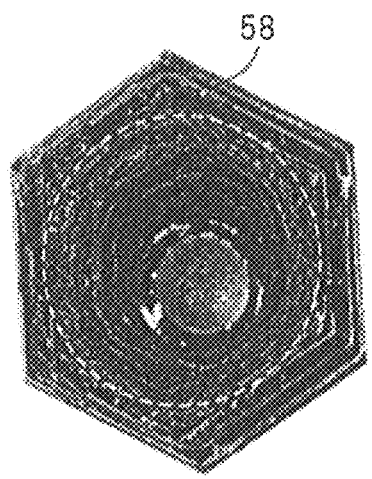
FIG. 9A is a microphotograph of an entire SiC single crystal grown in the Example.
Figure 9B:
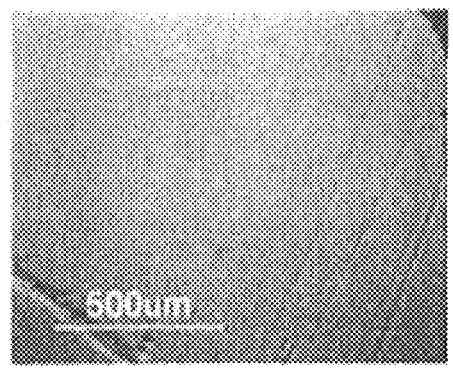
FIG. 9B is a microphotograph of a seed crystal region of a SiC single crystal grown in the Example.
Figure 9C:
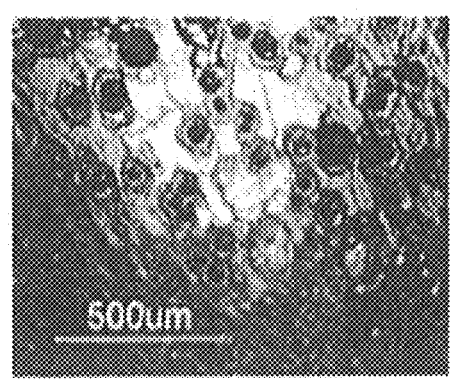
FIG. 9C is a microphotograph of a peripheral portion (a continuous region free of threading dislocations) of a SiC single crystal grown in the Example.

FIG. 9A is a microphotograph of an entire SiC single crystal containing the seed crystal obtained in Example 1 and the crystal grown from the seed crystal as an origin, observed from the bottom side (liquid surface side). FIG. 9B is a metallographic microscope photograph of a continuous region free of threading dislocations in the polished and etched enlarged diameter portion. FIG. 9C is a metallographic microscope photograph of a region with threading dislocations in the polished and etched seed crystal region. The dotted line 58 in FIG. 9A indicates a region directly below the seed crystal. FIG. 9B and FIG. 9C show that threading dislocations are present in the seed crystal part, but threading dislocations are not present in the enlarged diameter portion. The area of the continuous region free of threading dislocations is 122 mm², and the area of the region with threading dislocations (seed crystal region) is 113 mm². The area of the continuous region free of threading dislocations occupies 52% of the total area of the plane containing the seed crystal and the enlarged diameter portion. Similarly, the percentage of the area of the continuous region free of threading dislocations with respect to the total area of the plane containing the seed crystal and the enlarged diameter portion was measured for each of SiC single crystals grown in Examples 2 to 5 to find 69%, 90%, 64%, and 75% respectively. In each of the Examples, the area of the enlarged diameter portion was substantially identical with the area of the region free of threading dislocations. Although diameter enlargement growth did not substantially occur in Comparative Example 1, the grown crystal was in a hexagonal shape and the area thereof was larger than the area of the seed crystal by the area of corner parts of the hexagon, and the percentage of the area of those parts with respect to the total area was 27%.

Table 2 indicates the percentage of the area of the enlarged diameter portion with respect to the total area of the plane containing the seed crystal and the enlarged diameter portion for each of SiC single crystals produced in the Examples.

TABLE 2

|  | Percentage of enlarged diameter portion area with respect to total plane area containing seed crystal and enlarged diameter portion (%) |
|---|---|
| Example 1 | 52 |
| Example 2 | 69 |
| Example 3 | 90 |
| Example 4 | 64 |
| Example 5 | 75 |
| Comparative Example 1 | — |
| Comparative Example 2 | — |

Example 6

The SiC single crystal obtained in Example 1 was used as a seed crystal substrate as follows, and a SiC single crystal was further grown.

As illustrated schematically in FIG. 13, the etched observation surface of the SiC single crystal produced in Example 1 was mirror-polished and used as the bottom surface of a seed crystal. The surface which was used as the bottom surface of the seed crystal was a hexagonal surface parallel to the c-plane and having a diameter of 18 mm. The seed crystal was bonded with a graphite adhesive to a graphite shaft in a cylindrical shape having a length of 20 cm and a diameter of 12 mm such that the bottom surface of the seed crystal was parallel to the Si—C solution surface.

A crystal was grown for 10 hours in the same way as Example 1, except that a graphite shaft provided with a seed crystal was lowered to contact only the bottom surface of the seed crystal with the Si—C solution and the graphite shaft was then elevated immediately to place the same at a position of 1.5 mm above the liquid surface of the Si—C solution so that only the bottom surface of the seed crystal was maintained in a wet state with the Si—C solution but the side surfaces of the seed crystal were not maintained wetted with the Si—C solution.

The crystal growth amount perpendicular to the bottom surface of the seed crystal was 0.6 mm, and a SiC single crystal containing a hexaprismatic grown crystal with a diameter of 18 mm was obtained. In order to detect not only a threading dislocation but also a basal plane dislocation and a stacking fault, the obtained SiC single crystal was ground from the surface of the grown crystal on the liquid surface side with an offset angle of 4 degrees with respect to the c-plane, and etched. As a finishing mirror-polishing, buffing was carried out with an abrasive liquid containing diamond grains having a grain size of 1 µm. For etching, the polished SiC single crystal was immersed in 510° C.-molten potassium hydroxide for 4 min, and then washed ultrasonically with water.

Figure 16:
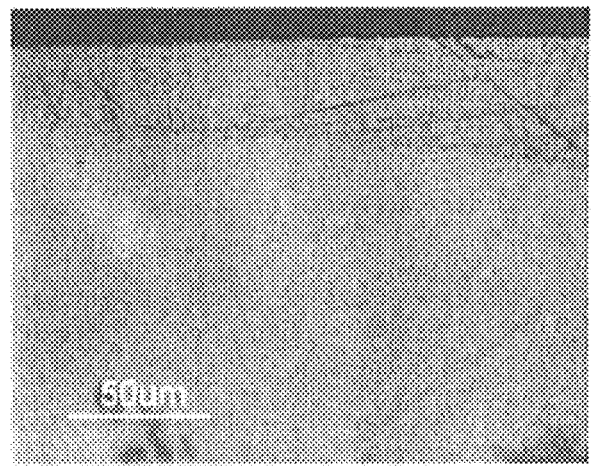
FIG. 16 is a microphotograph of a plane offset by 4 degrees from the c-plane of a SiC single crystal grown in the Example, after mirror-polishing and etching.

The etched surface of the obtained SiC single crystal was observed under a metallographic microscope to examine existence or nonexistence of a threading dislocation, a basal plane dislocation, and a stacking fault. FIG. 16 shows a metallographic microscope photograph of a continuous region free of a threading dislocation, a basal plane dislocation, and a stacking fault in the obtained SiC single crystal. It was confirmed that a threading dislocation, a basal plane dislocation, and a stacking fault were not present in a SiC single crystal grown just beneath the enlarged diameter portion of the SiC single crystal grown in Example 1. The percentage of the area of a continuous region free of threading dislocations, basal plane dislocations, and stacking faults with respect to the total area of the etched surface was 52%.

REFERENCE SIGNS LIST

100 Single crystal production apparatus
10 Graphite crucible
12 Graphite shaft
14 Seed crystal substrate
18 Heat insulating material
22 High-frequency coil
22A Upper high-frequency coil
22B Lower high-frequency coil
24 Si-C solution
26 Quartz tube
28 Meniscus
30 Grown crystal
32 Diameter enlarging angle
34 Bottom surface/side surface angle
36 Dislocation observation position
38 Plane parallel to c-plane and containing seed crystal and grown crystal in region 36
40 Region having dislocations
42 Continuous region free of dislocations
44 Enlarged diameter portion grown below bottom surface of seed crystal
46 Enlarged diameter portion
48 c-Plane growth portion
50 Enlarged diameter portion grown higher than bottom surface of seed crystal
52 Crystal after c-plane growth originated from continuous region 42
54 Crystal after c-plane growth originated from region 40 having dislocations
56 Seed crystal with peripheral portion free of threading dislocations
58 Region just beneath seed crystal

The invention claimed is:

1. A method of producing a SiC single crystal by a solution process, in which a SiC seed crystal is contacted with a Si—C solution with a temperature gradient such that the temperature of the Si—C solution decreases from the inside of the Si—C solution toward a surface of the Si—C solution, allowing the SiC single crystal to grow,
   wherein the method comprises:
   preparing a first SiC seed crystal comprising a bottom surface being a c-plane, a top surface held by a graphite shaft, and side surfaces, wherein the first SiC seed crystal contains threading dislocations;
   contacting the bottom surface and the side surfaces of the first SiC seed crystal with the Si—C solution while keeping the bottom surface of the first SiC seed crystal parallel to the surface of the Si—C solution to form a meniscus between the side surfaces of the first SiC seed crystal and the Si—C solution such that the graphite shaft does not come in contact with the Si—C solution;
   performing c-plane growth to grow a first SiC single crystal from the first SiC seed crystal allowing a diameter of the growing first SiC single crystal to enlarge so that the first SiC single crystal having the first SiC seed crystal, a c-plane growth portion, and an enlarged diameter portion, is obtained;
   cutting out a second SiC seed crystal out of the first SiC single crystal so that the cut-out second SiC seed crystal consists of the first SiC seed crystal and the enlarged diameter portion grown on an upper side of the bottom surface of the first SiC seed crystal, and has a c-plane, or cutting out a second SiC seed crystal out of the first SiC single crystal so that the cut-out second SiC seed crystal consists of the c-plane growth portion and the enlarged diameter portion grown on a lower side of the bottom surface of the first SiC seed crystal, and has a c-plane; and
   further growing a second SiC single crystal from the c-plane of the second SiC seed crystal, wherein the second SiC single crystal does not contain threading dislocations, basal plane dislocations, and stacking faults.

2. The method of producing a SiC single crystal according to claim 1, wherein an angle for enlarging the diameter of the first SiC single crystal is 35 degrees to 90 degrees, wherein the angle is an angle formed by a direction perpendicular to the bottom surface of the first SiC seed crystal and a direction along a top surface of the first SiC single crystal.

3. The method of producing a SiC single crystal according to claim 1, wherein a diameter of the graphite shaft holding the first SiC seed crystal is smaller than a minimum diameter of the top surface of the first SiC seed crystal.

4. The method of producing a SiC single crystal according to claim 1, wherein the angle between the bottom surface of the first SiC seed crystal and the side surface of the first SiC seed crystal is 90 to 155 degrees.

\* \* \* \* \*